United States Patent
Watanabe et al.

(10) Patent No.: US 7,348,871 B2
(45) Date of Patent: Mar. 25, 2008

(54) INDUCTANCE VARIABLE DEVICE

(75) Inventors: Daisuke Watanabe, Osaka (JP); Takuo Hino, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/727,358

(22) Filed: Mar. 26, 2007

(65) Prior Publication Data
US 2007/0176721 A1    Aug. 2, 2007

Related U.S. Application Data

(62) Division of application No. 11/252,751, filed on Oct. 19, 2005.

(30) Foreign Application Priority Data
Oct. 19, 2004   (JP)  ............................... 2004-304716

(51) Int. Cl.
    *H01F 5/00*    (2006.01)
(52) U.S. Cl. ....................................................... 336/200
(58) Field of Classification Search ................. 336/65, 336/83, 200, 232; 257/531
See application file for complete search history.

(56) References Cited
U.S. PATENT DOCUMENTS

| | | | |
|---|---|---|---|
| 6,121,850 A | 9/2000 | Ghoshal | |
| 6,317,008 B1 | 11/2001 | Gabara | |
| 6,573,822 B2 * | 6/2003 | Ma et al. | 336/223 |
| 6,597,248 B2 | 7/2003 | Shirai | |
| 6,650,195 B1 | 11/2003 | Brunn et al. | |
| 6,778,022 B1 | 8/2004 | Zhang et al. | |
| 6,806,779 B1 | 10/2004 | Kim et al. | |
| 7,042,326 B2 | 5/2006 | Gau | |
| 2002/0158711 A1 * | 10/2002 | Groves et al. | 333/174 |
| 2005/0068146 A1 * | 3/2005 | Jessie | 336/200 |
| 2006/0033602 A1 * | 2/2006 | Mattsson | 336/200 |

FOREIGN PATENT DOCUMENTS

| | | |
|---|---|---|
| JP | 58-173215 | 11/1983 |
| JP | 8-045739 | 2/1996 |
| JP | 8-055733 | 2/1996 |
| JP | 10-313093 | 11/1998 |
| JP | 11-154730 | 6/1999 |
| JP | 2002-9544 | 1/2002 |
| JP | 2002-151953 | 5/2002 |
| JP | 2003-78017 | 3/2003 |

* cited by examiner

*Primary Examiner*—Tuyen T. Nguyen
(74) *Attorney, Agent, or Firm*—Wenderoth, Lind & Ponack, L.L.P.

(57) ABSTRACT

A inductance variable device includes a first inductor, a second inductor magnetically coupled to the first inductor, a current source whose current is variable, electrically connected to the first inductor, and a current control unit. The current control unit controls a current flowing from the current source to the first inductor according to a feedback signal having frequency information in a current flowing in the second inductor to vary a combined inductance of the second inductor.

10 Claims, 9 Drawing Sheets

(b)

INDUCTANCE VARIABLE DEVICE

This application is a divisional application of application Ser. No. 11/252,751, filed Oct. 19, 2005.

BACKGROUND OF THE INVENTION

1. Technical Field

The present invention relates to an inductance variable device in which inductance can be varied.

2. Background Art

An inductor device in which inductance can be varied by electrical means is used for such as a resonance circuit in which a resonance frequency can be varied over a large frequency range. In the description below, an element having an inductance such as a coil is referred to as an "inductor", and a device comprising inductors is referred to as an "inductor device".

An example of conventional inductor devices is disclosed in Japanese Patent Laid-open Publication No. 2002-151953. This inductor device will be described with reference to FIGS. 8 to 10.

An inductor device 40 shown in FIG. 8 includes a square frame-shaped main inductor 41 formed of a conductor on an insulation substrate (not shown), and a sub inductor 42 formed outside the main inductor 41 and having a square frame shape larger than that of the main inductor 41. A part of the frame of the main inductor 41 is cut so that terminals 41a and 41b are led to the outside. In addition, a part of the frame of the sub inductor 42 is cut so that terminals 42a and 42b are formed. A first switch 44 serving as a semiconductor switch is connected to the terminals 42a and 42b. In addition, a second switch 46 is connected between the terminal 42b and a circuit ground G.

When an alternate current is applied to the main inductor 41 and the first switch 44 is closed to short-circuit the terminals 42a and 42b, inductance of the main inductor 41 is varied by magnetic coupling. When the first switch 44 is closed, the second switch 46 is opened. When the first switch 44 is opened, the second switch 46 is closed and the sub inductor 42 is grounded.

According to another conventional inductor device 50 shown in FIG. 9, inside a square frame-shaped main inductor 51, a square frame-shaped sub inductor 52 which is smaller than the main inductor 51 is provided. A part of the frame of the main inductor 51 is cut so that terminals 51a and 51b are led to the outside. In addition, a part of the frame of the sub inductor 52 is cut so that terminals 52a and 52b are provided, and a first switch 53 is connected between the terminals 52a and 52b. In addition, a second switch 54 is connected between the terminal 52b and a circuit ground G. When an alternate current is applied to the main inductor 51 and the first switch 53 is closed to short-circuit the terminals 52a and 52b, inductance of the main inductor 51 is varied by magnetic coupling. When the first switch 53 is closed, the second switch 54 is opened. When the first switch 53 is opened, the second switch 54 is closed and the sub inductor 52 is grounded.

According to still another inductor device 60 shown in FIG. 10, a spiral shaped sub inductor 62 is formed so as to overlap with a spiral main inductor 61. A first switch 63 is connected between terminals 62a and 62b of the sub inductor 62. In addition, a second switch 64 is connected to the terminal 62b and a circuit ground. When an alternate current is applied to the main inductor 61 and the first switch 63 is closed to short-circuit the terminals 62a and 62b, inductance of the main inductor 61 is varied by magnetic coupling. When the first switch 63 is closed, the second switch 64 is opened. When the first switch 63 is opened, the second switch 64 is closed and the sub inductor is grounded. According to the constitutions shown in FIGS. 8 to 10, the inductance of each of the inductor devices 40, 50 and 60 can be varied by increasing or decreasing the number of spirals of the main inductor.

In addition, Japanese Patent Laid-open Publication No. 2002-9544 discloses a voltage control oscillator including an inductor for the oscillator and a control inductor. According to this voltage control oscillator, a current to be applied to the control inductor is set to a predetermined value and a predetermined mutual inductance is generated in the inductor for the oscillator.

SUMMARY

According to the conventional inductor devices 40, 50 and 60 shown in FIGS. 8 to 10, the inductance of the main inductor can be varied by opening or closing the first switch. Since the inductance is varied by the switch, the inductance is varied between two inductance values and the inductance cannot be varied sequentially.

In addition, according to the voltage control oscillator described in the Japanese Patent Laid-open Publication No. 2002-9544, since a predetermined current value is applied to the control inductor and the predetermined mutual inductance is generated in the inductor for the oscillator, when a circuit comprising the inductor for the oscillator is varied, a desired inductance cannot be provided.

It is an object of the present invention to provide an inductance variable device in which an inductance can be sequentially and largely varied and a desired inductance can be set even when a circuit comprising an inductor is varied.

A inductance variable device according to the present invention is characterized in that the inductance variable device includes:

a first inductor;

a second inductor magnetically coupled to the first inductor;

a current source whose current is variable, electrically connected to the first inductor; and a current control unit operable to control a current flowing from the current source to the first inductor according to a feedback signal having frequency information in a current flowing in the second inductor to vary a combined inductance of the second inductor.

In addition, the current control unit may include:

a frequency divider for dividing a frequency of the feedback signal to a predetermined frequency;

a phase detector for comparing a phase of the frequency divided signal with a phase of a reference signal having predetermined frequency information; and a charge pump for outputting a voltage to the current source according to an input from the phase detector. In this case, the current control unit can adjust a current value to be applied to the first inductor, according to the input signal from the charge pump.

Furthermore, the current source may include:

a plurality of coarse adjustment current sources operable to coarsely adjust a current value, in which each coarse adjustment current source is set to a different predetermined coarse adjustment current value; and a fine adjustment current source operable to finely adjust a current value according to an input signal from the charge pump.

In addition, the frequency divider may include:

a prescaler for dividing a frequency of an input signal by any of several ratios; and a counter for dividing a frequency of an input signal by a predetermined ratio.

Furthermore, the above inductance variable device may include a switch provided between the first inductor and the current source. The switch can connect the first inductor with the current source and disconnect the first inductor from the current source.

Still furthermore, the first and second inductors may be formed in a semiconductor integrated circuit on a semiconductor substrate. These first and second inductors may be spirally formed of a strip-shaped conductor having one or more spirals.

In addition, the current source may be a DC power source. The current source may convert a direction of a direct current to be applied to the first inductor.

In addition, the current source may be an AC power source.

An IC chip according to the present invention is characterized in that the IC chip includes:

a first inductor provided on a semiconductor substrate;

a second inductor provided on the semiconductor substrate so as to be magnetically coupled to the first inductor;

a current source whose current is variable, electrically connected to the first inductor;

a frequency divider for dividing a frequency of a feedback signal having frequency information in a current flowing in the second inductor to a predetermined frequency;

a phase detector for comparing a phase of the frequency divided signal with a phase of a reference signal having predetermined frequency information; and a charge pump for outputting a voltage to the current source according to an input from the phase detector, wherein the first and second inductors, the current source, the frequency divider, the phase detector, and the charge pump are constituted as a semiconductor integrated circuit. Then, the current source is adjusted according to an input signal from the charge pump.

In addition, the current source may include:

a plurality of coarse adjustment current sources operable to coarsely adjust a current value, in which each coarse adjustment current source is set to a different predetermined coarse adjustment current value; and a fine adjustment current source operable to finely adjust a current value according to an input signal from the charge pump.

Furthermore, the frequency divider may include:

a prescaler for dividing a frequency of an input signal by any of several ratios; and a counter for dividing a frequency of an input signal by a predetermined ratio.

According to the present invention, a method of varying inductance in a inductance variable device having a first inductor, a second inductor provided so as to be magnetically coupled to the first inductor, and a current source whose current is variable and that is electrically connected to the first inductor, includes:

(a) applying a predetermined current from the current source to the first inductor;

(b) dividing a frequency of a feedback signal having frequency information in a current flowing in the second inductor so as to be able to be compared with a reference signal;

(c) comparing a phase of the signal whose frequency was divided with a phase of the reference signal and outputting a difference signal corresponding to its difference; and (d) finely adjusting a current value to be applied to the first inductor by a voltage corresponding to the difference signal, to control the current value to be applied to the first inductor by repeating the above steps (b) to (d) so that the difference between the frequency divided signal and the reference signal becomes small and a combined inductance in the second inductor is set to a predetermined value.

According to the present invention, by applying a current to the first inductor which is one of the two inductors magnetically coupled to each other and then changing the current value, the inductance of the second inductor, which is the other of the two inductors, can be varied. In this case, the current to be applied to the first inductor is finely adjusted according to a feedback signal having frequency information in the current flowing in the second inductor, and thus a combined inductance in the second inductor can be set to a predetermined value. By this, a resonance frequency in a resonance circuit including the second inductor can be set to various resonance frequencies such as 800 MHz, 1.7 GHz for a mobile phone, for example.

BRIEF DESCRIPTION OF THE DRAWINGS

The present invention will become readily understood from the following description of preferred embodiments made with reference to the accompanying drawings, in which like parts are designated by like reference numeral and in which.

PREFERRED EMBODIMENTS OF THE PRESENT INVENTION

Figure 1:
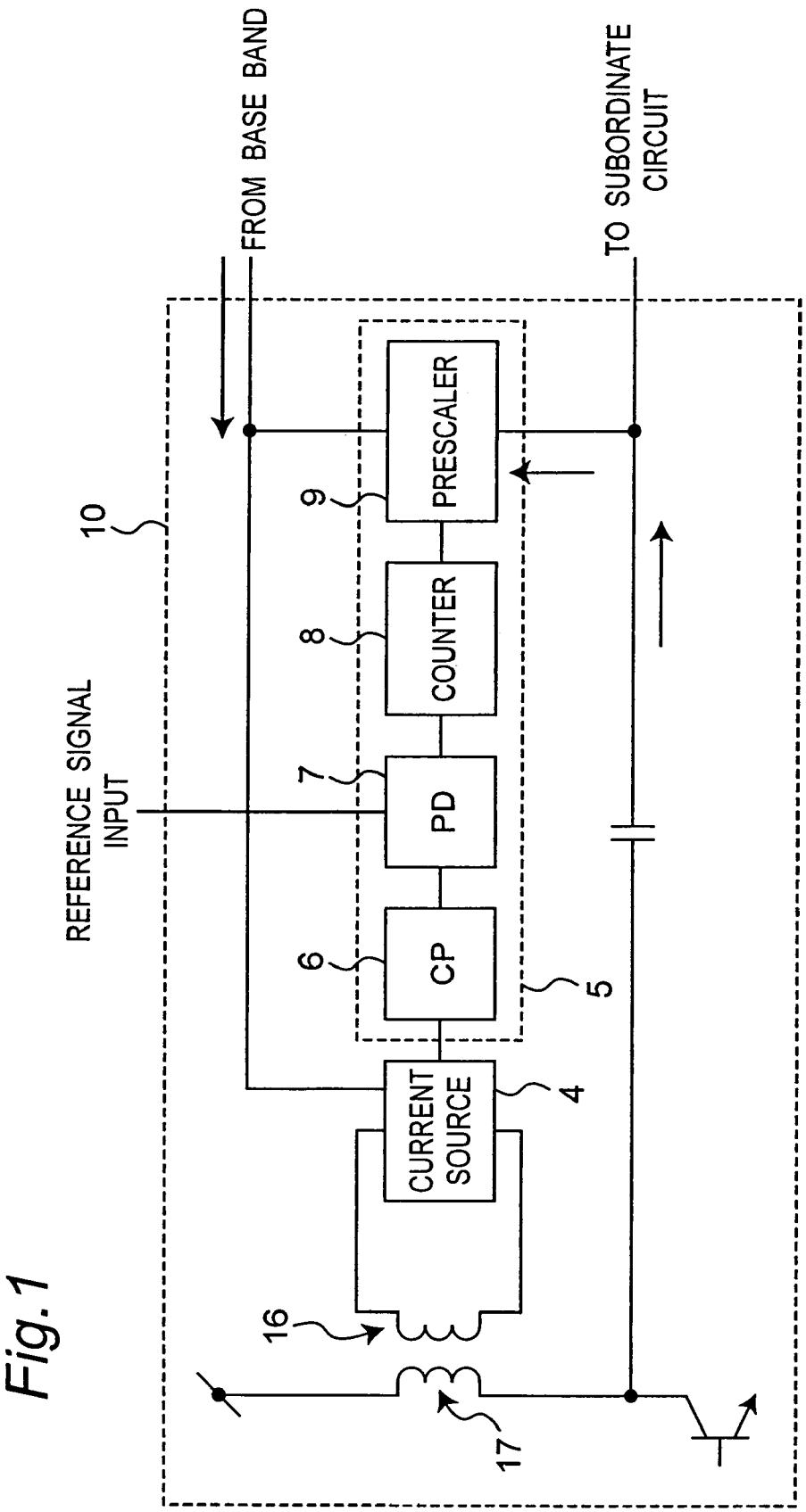
FIG. 1 is a block diagram showing a constitution of an inductance variable device according to a first embodiment of the present invention.

Preferred embodiments of an inductance variable device according to the present invention will be described with reference to the accompanied drawings hereinafter. In addition, the same reference numerals are allotted to the same member essentially in the drawings.

First Embodiment

FIG. 1 is a block diagram showing a constitution of an inductance variable device 10 according to a first embodiment of the present invention. The inductance variable device 10 includes a first inductor 16, a second inductor 17 arranged so that it can be coupled to the first inductor 16 magnetically, a current source 4 applying a current to the first inductor 16, a charge pump (CP) 6, a phase detector (PD) 7, a counter 8 and a prescaler 9. The first and second inductors 16 and 17 may be provided on a semiconductor substrate. In this case, the first and second inductors 16 and 17 may be stacked. In addition, the first and second inductors 16 and 17, the current source 4, the charge pump (CP) 6, the phase detector (PD) 7, the counter 8 and the prescaler 9 may be constituted as a semiconductor integrated circuit. By thus, the inductance variable device 10 can be constituted as an IC chip.

Figure 2:
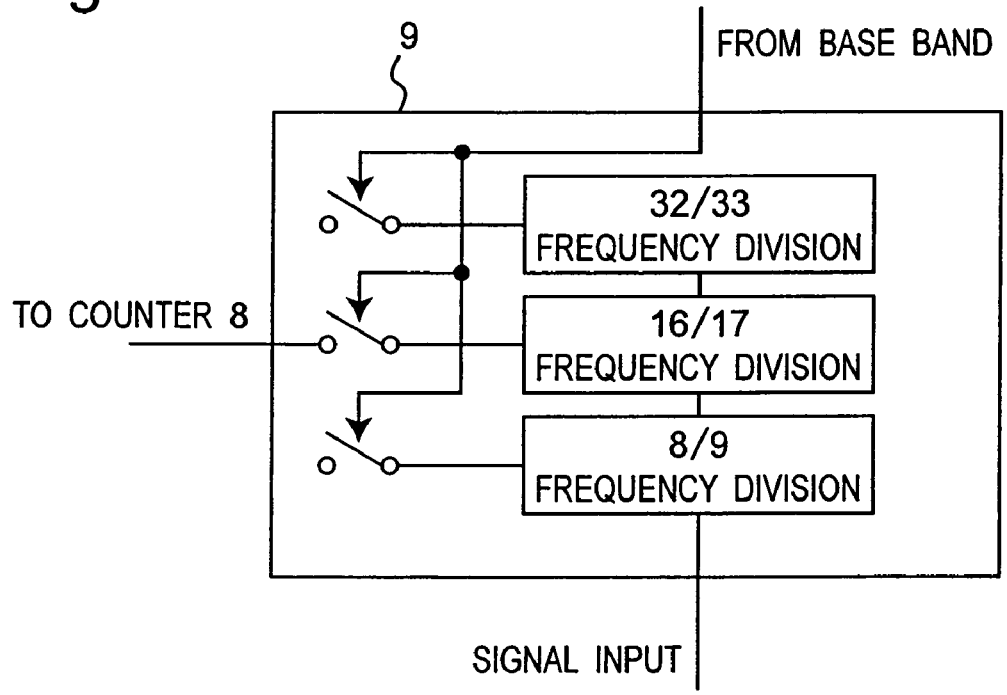
FIG. 2 is a block diagram showing a constitution of a prescaler shown in FIG. 1 in detail.

FIG. 2 is a block diagram showing a constitution of the prescaler 9 in detail. In the prescaler 9, a frequency can be divided in a fixed frequency division ratio 32/33, 16/17 or 8/9 according to a digital signal from a base band (BB) depending on a desired frequency of an input signal. In addition, the counter 8 can divide the frequency to 1/20. In addition, a frequency divider consists of the prescaler 9 and the counter 8.

The phase detector (PD) 7 compares a phase of a reference signal frequency of 5 MHz with a phase of a frequency of the signal divided by the divider including the prescaler 9 and the counter 8 and outputs a signal corresponding to a phase difference. The charge pump 6 outputs a voltage signal for fine adjustment to the current source 4, corresponding to the phase difference signal outputted from the phase detector 7.

Figure 3:
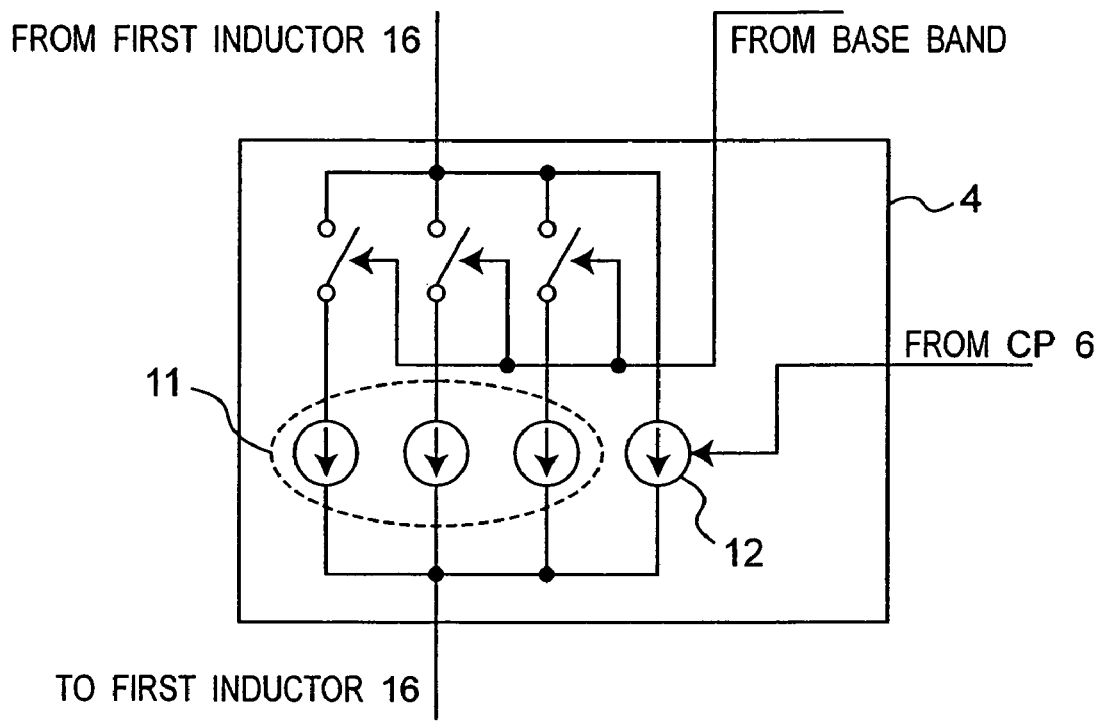
FIG. 3 is a block diagram showing a constitution of a current source shown in FIG. 1 in detail.

FIG. 3 is a block diagram showing a constitution of the current source 4 in detail. The current source 4 includes coarse adjustment current sources 11 and a fine adjustment current source 12. Here, three kinds of current sources are shown as the coarse adjustment current source 11. The current source 4 switches the coarse adjustment current sources 11 having different current abilities corresponding to the desired frequencies of the input signals, according to a digital signal from the base band. In addition, it adjusts the fine adjustment current source 12 by a voltage outputted from the charge pump 6, according to a feedback signal from the second inductor 17.

In addition, a combined inductance $L_{total}$ which is generated in the second inductor 17 by a current value $i_1$ applied to the first inductor 16 is provided from the following equation.

$$L_{total} = L_2 + M \frac{i_1}{i_2}$$

Here, a character $L_2$ designates a self-inductance of the second inductor 17. A character M designates a mutual inductance of the first and second inductors 16 and 17. In addition, reference character $i_1$ designates a current value to be applied to the first inductor 16. Furthermore, $i_2$ designates a current value flowing in the second inductor 17.

According to the above equation, it is thought that when a predetermined current value $i_1$ is applied to the first inductor 16, the desired combined inductance $L_{total}$ can be provided in the second inductor 17. However, as the current value $i_2$, and such, flowing in the second inductor 17 varies, there are cases in which the desired combined inductance $L_{total}$ cannot be provided with the predetermined current value provided from the coarse adjustment current source 11. Thus, according to the inductance variable device 10, the current value $i_1$ to be applied to the first inductor 16 is finely adjusted by the feedback signal from the second inductor 17 so that the desired $L_{total}$ can be provided in the second inductor 17.

Next, an operation of the inductance variable device 10 will be described hereinafter. According to the inductance variable device 10, the combined inductance $L_{total}$ in the second inductor 17 can be set to a predetermined value when the current value to be applied to the first inductor 16 is set to a predetermined value. Thus, a resonance frequency of a resonance circuit including the second inductor 17 can be set to a predetermined value. According to the operation of the inductance variable device 10, the current value is coarsely adjusted first and then finely adjusted according to the signal from the second inductor 17.

(a) A signal having RF frequency information and the like is inputted to the base band (BB) IC through an external amplifier and the like.

(b) The frequency information from the base band is inputted to the inductance variable device 10 in the form of a digital signal.

(c) The coarse adjustment current source 11 in the current source 4 is selected according to the inputted frequency information, and a current is applied from the selected coarse adjustment current source 11 to the first inductor 16 (coarse adjustment). According to this coarse adjustment, a current value to be applied to the first inductor 16 is previously calculated and the coarse adjustment current sources 11 which were set to respective coarse adjustment current values are provided, so that the resonance frequency in the resonance circuit including the second inductor 17 can be set to resonance frequencies 800 MHz, 1.7 GHz, 2.1 GHz and the like for a mobile phone. Thus, the coarse adjustment current source 11 corresponding to the frequency information can be selected.

(d) In addition, the frequency to be divided by the prescaler 9 is selected according to the inputted frequency information.

(e) Then, the signal (feedback signal) from the second inductor 17 is inputted to the prescaler 9. The frequency of the inputted signal is divided so as to be able to be compared with the reference signal by the prescaler 9 and the counter 8. In addition, signal intensity reaches an acceptable value of input sensitivity of the prescaler 9 by the above coarse adjustment.

(f) The phase detector 7 compares a phase of the signal whose frequency was divided with a phase of the reference signal and its difference signal is outputted to the charge pump 6.

(g) The charge pump 6 outputs a voltage corresponding to the inputted difference signal to the fine adjustment current source 12 of the current source 4.

(h) The fine adjustment current source 12 finely adjusts the current value to be applied to the first inductor 16 by the voltage from the charge pump 6.

(i) The current value to be applied to the first inductor 16 is controlled so that a difference between the signal whose frequency was divided and the reference signal may converge, that is, become small by repeating the above steps (e) to (h), whereby the combined inductance $L_{total}$ in the second inductor 17 is set to the predetermined value. Thus, the resonance frequency of the resonance circuit including the second inductor 17 can be set to the predetermined resonance frequency, for example. More specifically, it can be set to various resonance frequencies such as 800 MHz, 1.7 GHz, 2.1 GHz for a mobile phone.

As described above, according to the inductance variable device 10, the combined inductance $L_{total}$ in the second inductor 17 can be set to the predetermined value by finely adjusting the current value after coarsely adjusting the current value to be applied to the first inductor 16 and having the signal from the second inductor 17 feed back.

Second Embodiment

A inductance variable device according to a second embodiment of the present invention will be described with reference to FIGS. 4 to 6B.

Figure 4:
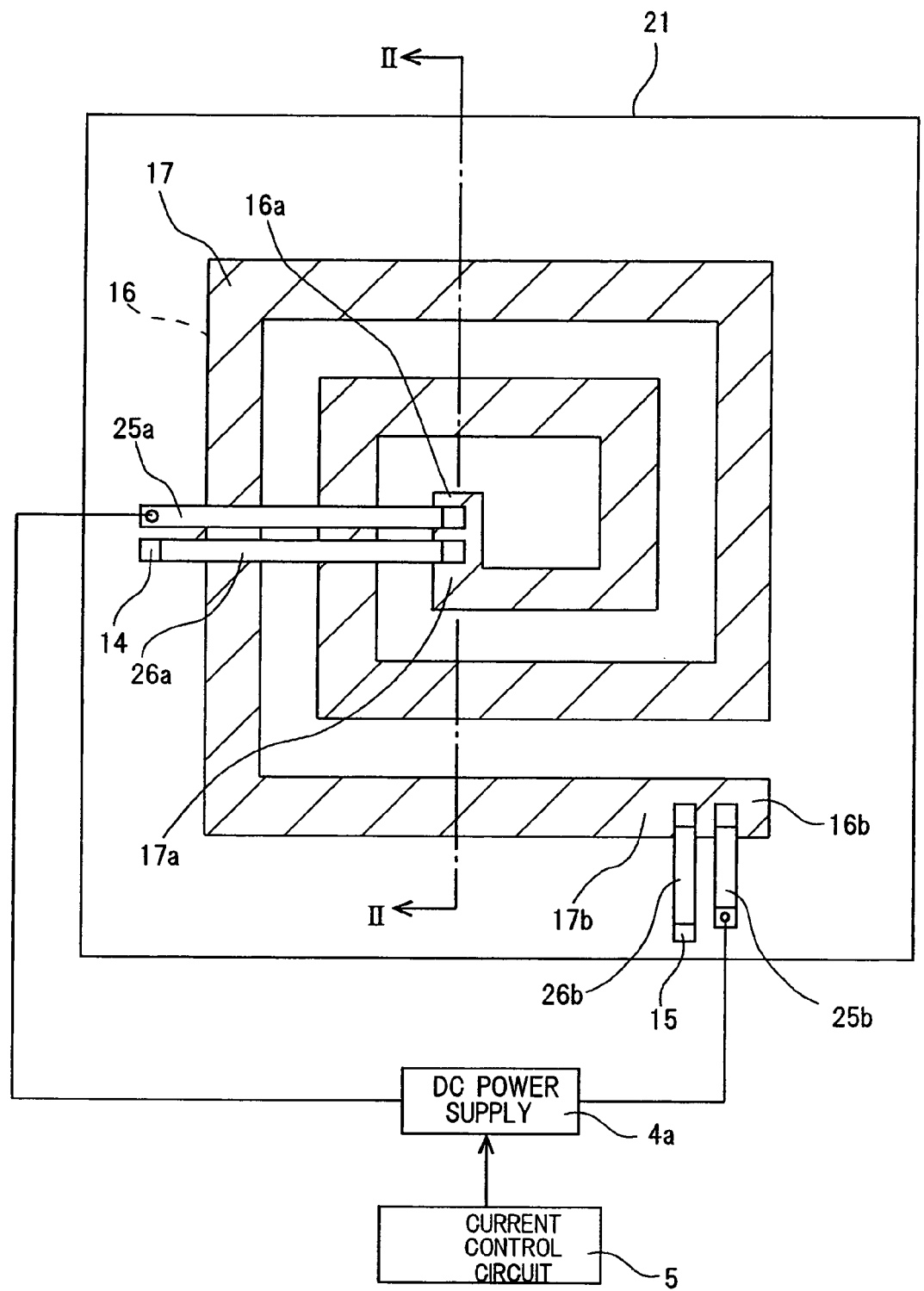
FIG. 4 is a plan view showing an inductance variable device according to a second embodiment of the present invention.
Figure 5:
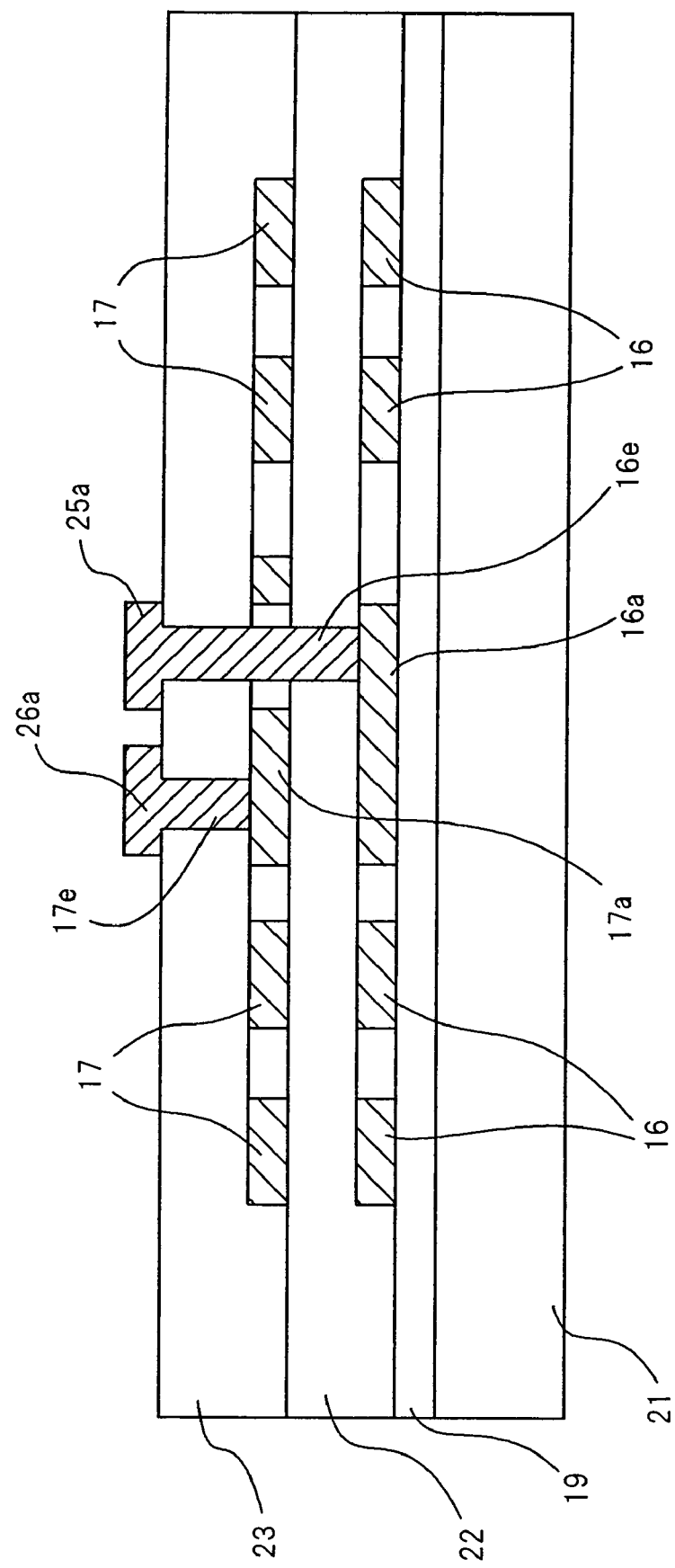
FIG. 5 is a sectional view taken along line II-II in FIG. 4.

FIG. 4 is a plan view showing the inductance variable device according to the second embodiment of the present invention. FIG. 5 is a sectional view taken along line II-II in FIG. 4. In the plan view in FIG. 4, a conductor is hatched, and in the sectional view in FIG. 5, only the conductor is hatched to make the drawings clear. In FIGS. 4 and 5, an insulation film 19 is formed on a surface of a substrate 21 such as a nonmagnetic substrate or a semiconductor substrate, and a first inductor 16 which is a strip-shaped conductor film and spirally formed into a rectangle (square, for example) is formed on the insulation film 19. An insulation film 22 is provided on the first inductor 16 and a second inductor 17 which is also a strip-shaped conduction film having the same width as that of the first inductor 16 and spirally formed into a rectangle so as to overlap with the first inductor 16 on the insulation film 22. An insulation film 23 is formed on the second inductor 17. An inner end 16a of the first inductor 16 is connected to a lead conductor 25a provided on a surface of the insulation film 23 through a conductor post 16e which penetrates the insulation films 22 and 23 so as not to come in contact with an inner end 17a of the second inductor 17. The inner end 17a of the second inductor 17 is connected to a lead conductor 26a through a conductor post 17e which penetrates the insulation film 23. In addition, a part having the first inductor 16, the first insulation film 22, the second inductor 17, the second insulation film 23, and the first and second lead conductors 25a and 26a in the inductance variable device shown in FIG. 5 may be vertically reversed and formed on the insulation film 19. In this structure, the inductance variable device can be appropriately mounted on a substrate such as an IC substrate.

Similarly, an outer end 16b of the first inductor 16 is connected to a lead conductor 25b through a conductor post (not shown). An outer end 17b of the second inductor 17 is connected to a lead conductor 26b through a conductor post (not shown). A DC power supply 4a is connected between the lead conductors 25a and 25b. A terminal 14 of the lead conductor 26a and a terminal 15 of the lead conductor 26b are terminals to connect the second inductor 17 to an external circuit. A size of the first and second inductors 16 and 17 is 200 μm square, for example, and when the inductance variable device according to the present invention is incorporated in an integrated circuit, a width of the strip-shaped conductor is about 10 μm. The configuration of the first and second inductors 16 and 17 is not limited to a spiral rectangle, it may be other configurations such as a circle, a hexagon, an octagon.

The DC power supply 4a is provided to apply a predetermined direct current to the first inductor 16 and a current value and a current direction in the first inductor 16 can be controlled by a current control circuit 5. When the current value of the first inductor 16 is varied, a magnetic flux density of the first inductor 16 can be varied and the inductance of the second inductor 17 which is magnetically coupled to the first inductor 16 can be varied.

Figure 6A:
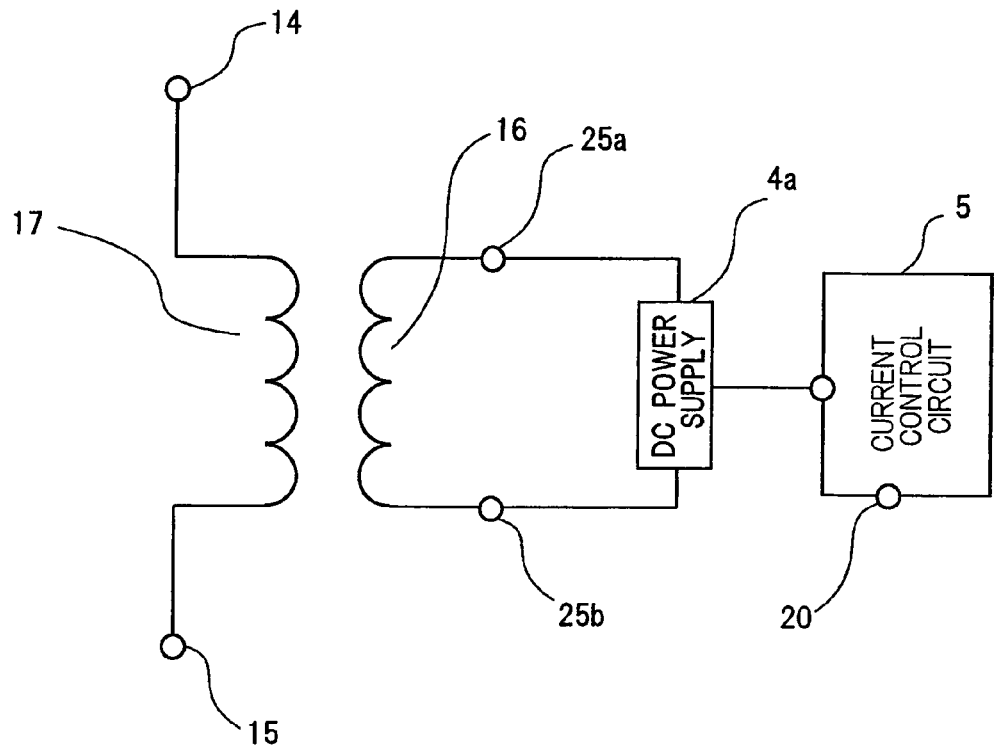
FIG. 6A shows an equivalent circuit of the inductance variable device according to the present invention when the current source is a DC power source.

FIG. 6A is an equivalent circuit of the inductance variable device shown in FIG. 4. The first inductor 16 is magnetically coupled to the second inductor 17 and both ends of the first inductor 16 are connected to both terminals of the DC power supply 4a. The second inductor 17 has both terminals 14 and 15. The current control circuit 5 has an input terminal 20. Thus, the current control circuit 5 receives a control signal from the outside by the input terminal 20 and it can vary a direction of a current and a value thereof applied from the DC power supply 4a to the first inductor 16.

Figure 6B:
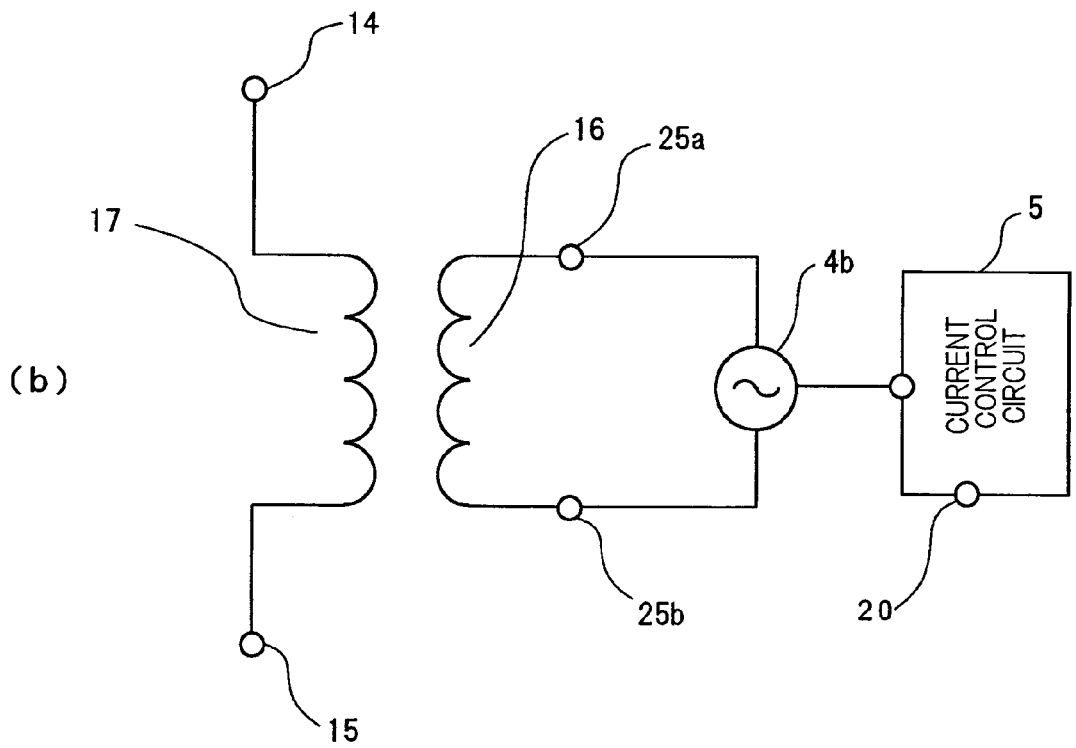
FIG. 6B shows an equivalent circuit of the inductance variable device according to the present invention when the current source is an AC power source.

FIG. 6B is an equivalent circuit of the inductor device when an alternate current is applied to the first inductor 16. An AC power supply 4b is connected to the first inductor 16 as a current source. The alternate current is induced in the second inductor 17 and its inductance is varied by the alternate current flowing in the first inductor 16.

Third Embodiment

Figure 7:
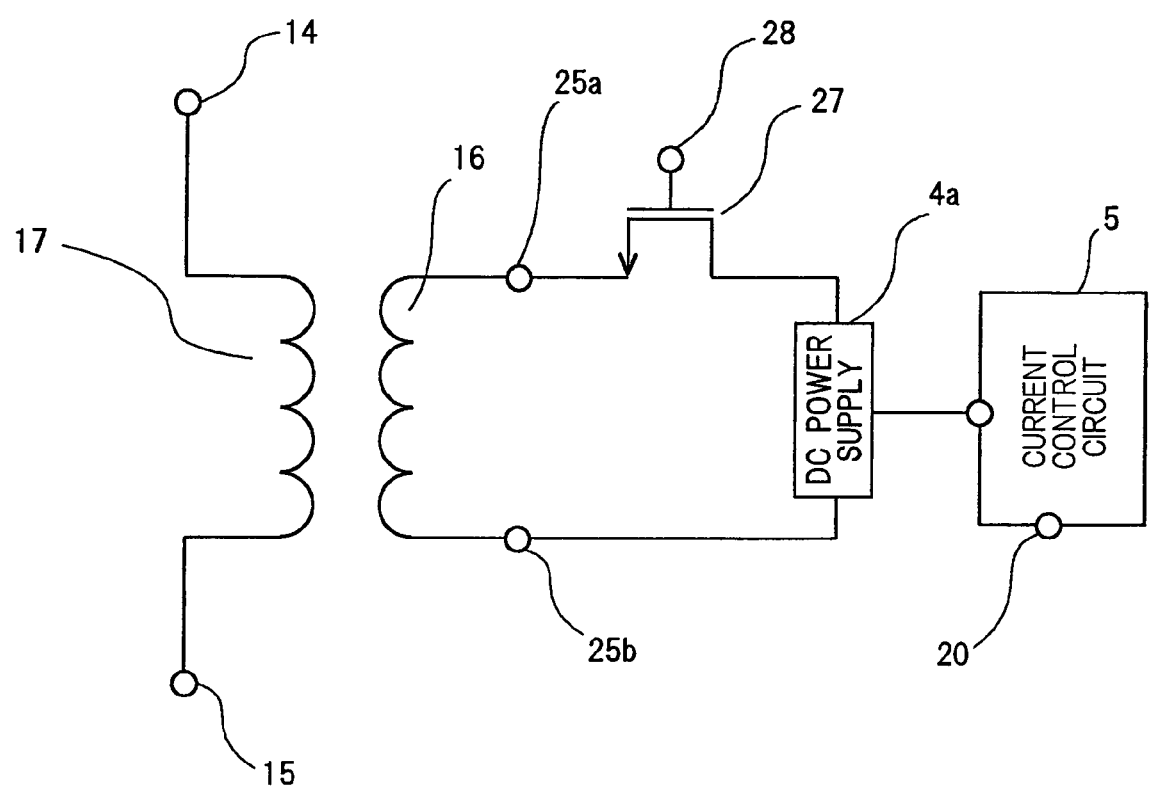
FIG. 7 shows an equivalent circuit of an inductance variable device according to a third embodiment of the present invention.
Figure 8:
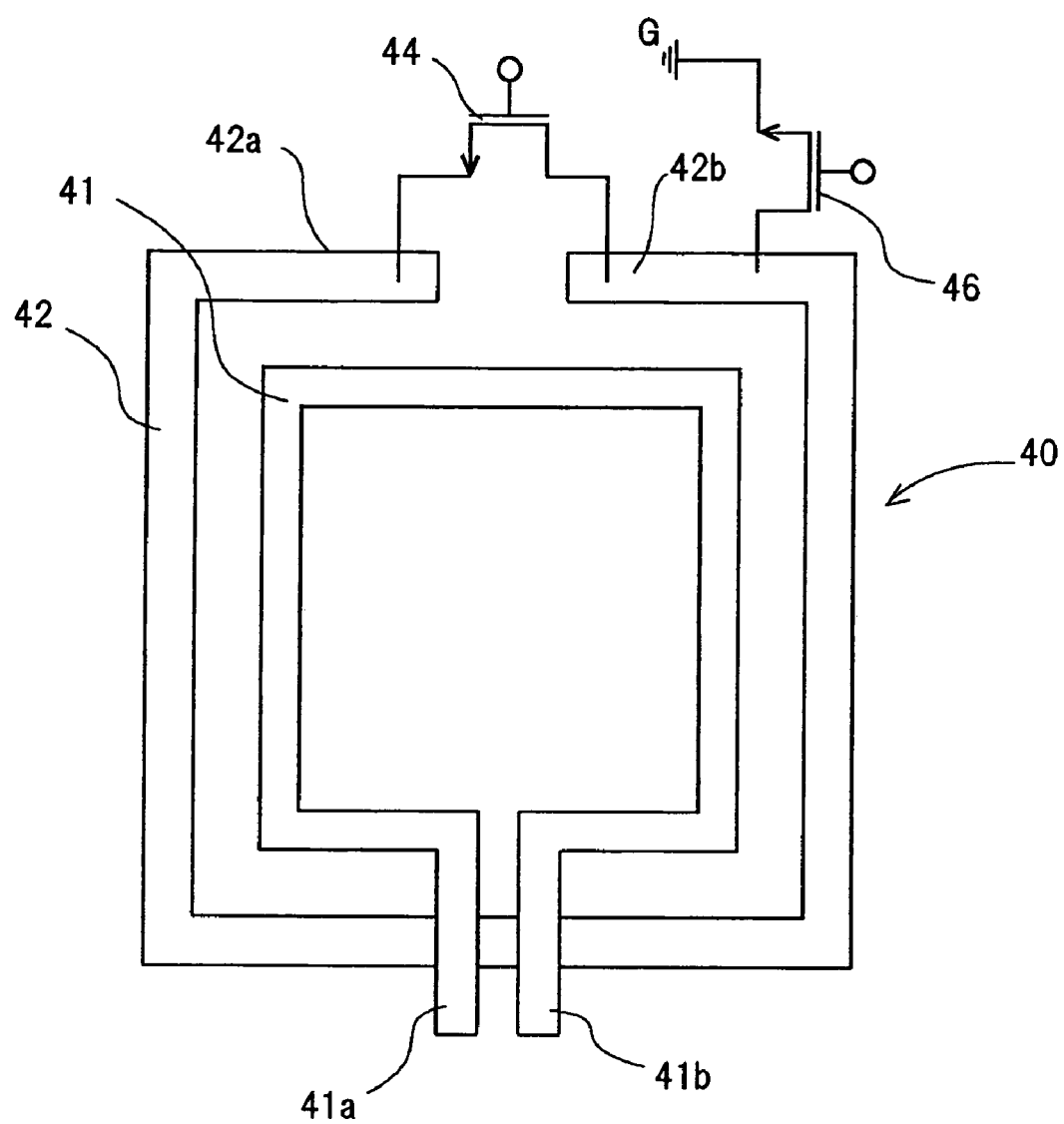
FIG. 8 is a plan view showing a conventional inductor device according to a first example.
Figure 9:
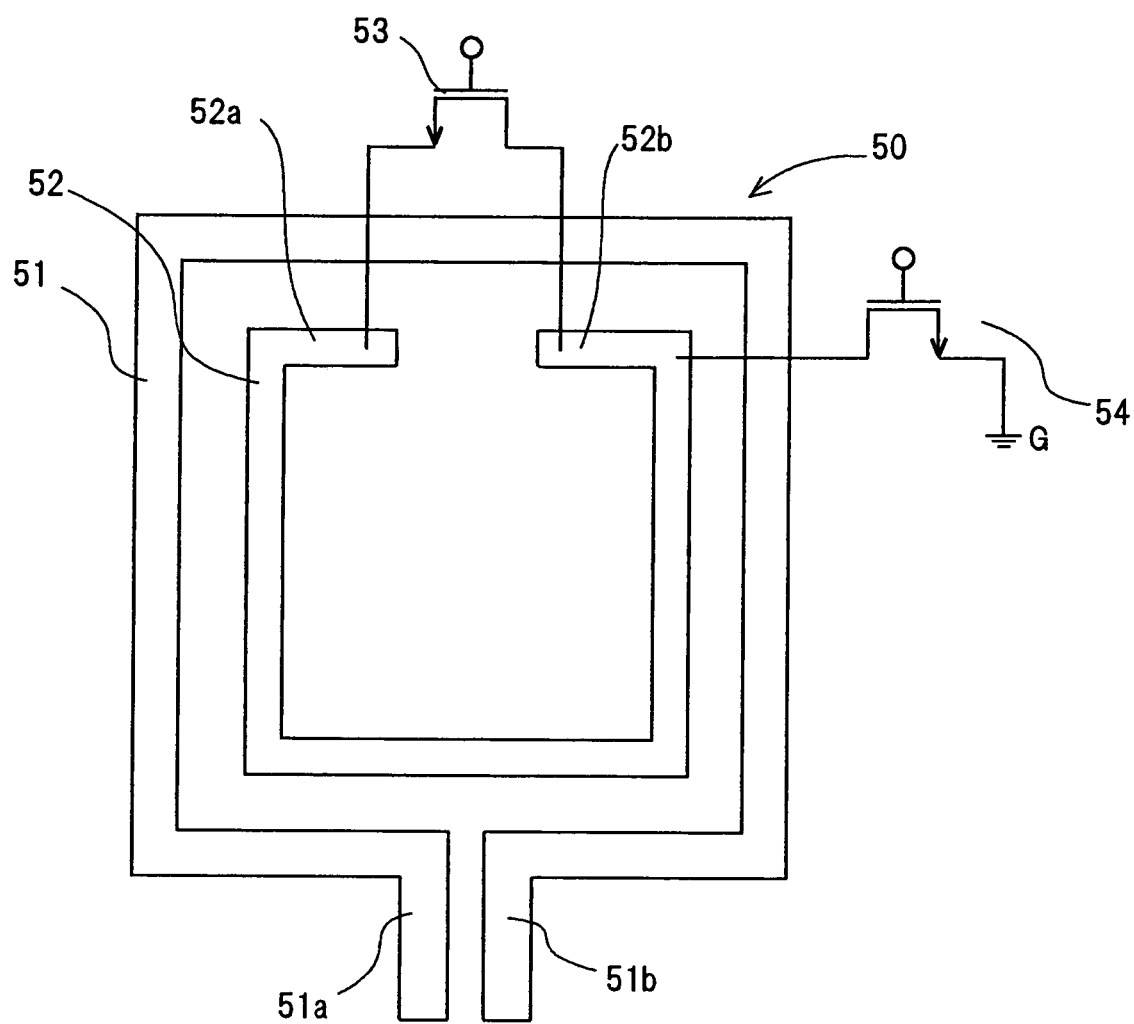
FIG. 9 is a plan view showing a conventional inductor device according to a second example.
Figure 10:
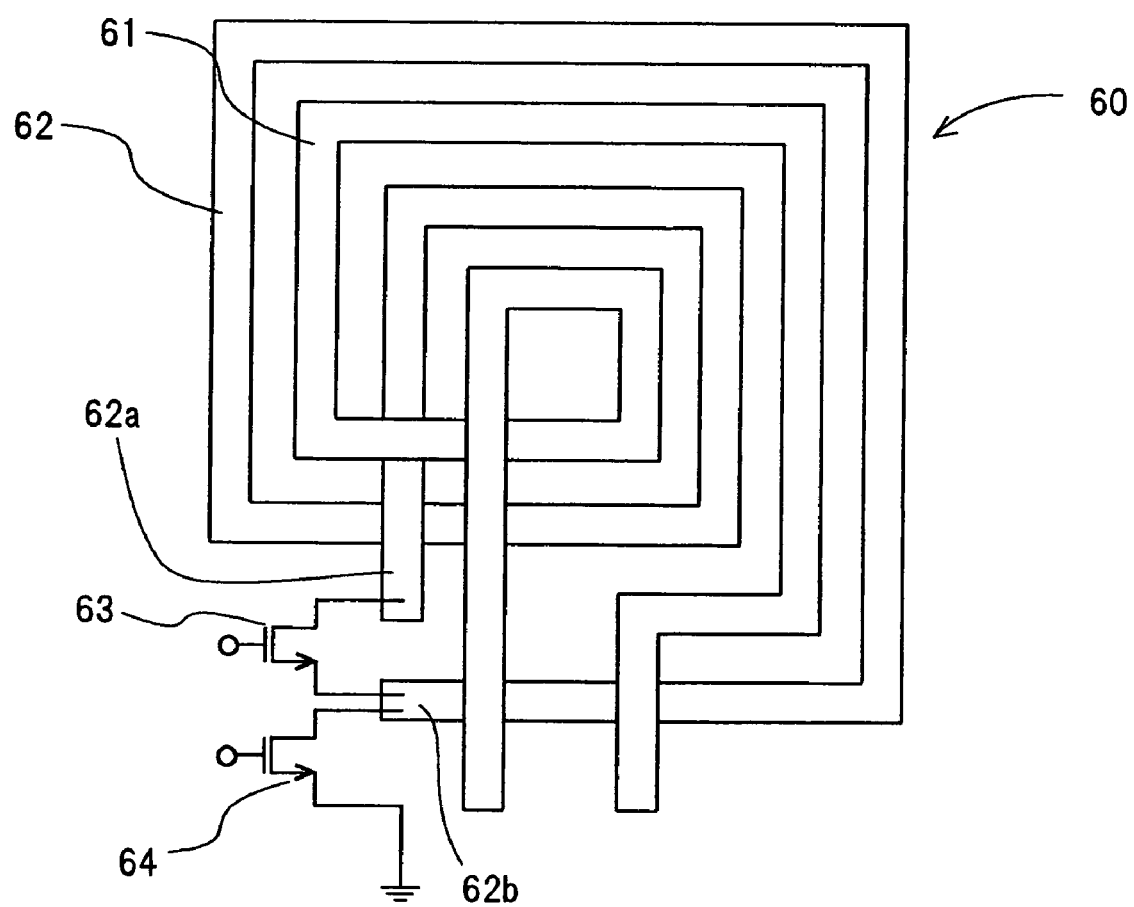
FIG. 10 is a plan view showing a conventional inductor device according to a third example.

FIG. 7 is an equivalent circuit of an inductance variable device according to a third embodiment of the present invention. Referring to FIG. 7, a first inductor 16, a second inductor 17, a DC power supply 4a and a current control circuit 5 have the same constitution of those in the second embodiment. According to the inductance variable device shown in FIG. 7, a switch 27 including a semiconductor element is provided between the first inductor 16 and the DC power supply 4a. When a control input is applied to a control terminal 28 of the switch 27, the switch 27 is closed.

According to the inductance variable device shown in FIG. 7, when the same operation as that of the inductance variable device shown in FIG. 4 is performed, the switch 27 is closed and a direct current is applied to the first inductor 16. When the switch 27 is opened and the direct current is not applied to the first inductor 16, the second inductor 17 becomes an inductor having a constant inductance.

The present invention may also have the following constitution shown in various embodiments.

According to a first constitution, the inductance variable device according to the present invention includes a first inductor, a second inductor magnetically coupled to the first inductor, and a current source whose current is variable, electrically connected to the first inductor.

According to the present invention, when a current to be applied to the first inductor is varied, a magnetic flux of the second inductor which is magnetically coupled to the first inductor is varied. By the magnetic flux being varied, the inductance of the second inductor is varied. When a current value and a current direction to be applied to the first inductor is varied, the inductance variable device can vary its inductance over a large range.

According to a second constitution, the inductance variable device according to the present invention is characterized in that the inductance variable device includes:

a nonmagnetic substrate having a first insulation film on one surface;

a first inductor in which a strip-shaped conductor layer is spirally formed on the first insulation film;

a second insulation film covering the first inductor;

a second inductor in which a conductor layer is formed on the first inductor through the second insulation film;

a third insulation film formed on the second inductor;

a pair of first lead conductors penetrating the second and third insulation films, in which respective one ends are connected to both ends of the first inductor and respective other ends are led to a surface of the third insulation film;

a pair of second lead conductors for penetrating the third insulation film, in which respective one ends are connected to both ends of the second inductor and respective other ends are led to a surface of the third insulation film; and a current source whose current is variable, electrically connected to the pair of first lead conductors.

According to the present invention, it is possible to constitute the inductance variable device capable of varying its inductance from the conductor layers and the insulation films formed on the nonmagnetic substrate. Since the conductor layer and the insulation film can be formed on the same substrate on which the semiconductor element is formed in a process of manufacturing a semiconductor integrated circuit, the manufacturing process of the inductance variable device becomes simple, and therefore it is possible to reduce the size and cost of the inductance variable devices.

Although the present invention has been detailed in the above mode for carrying out the invention with reference to the above embodiments, the present invention is not limited to the above-described embodiments. It is obvious for those skilled in the art that various modifications and variations that are preferred may be included in the scope of the present invention described in the claims below.

What is claimed is:

1. An inductance variable device comprising:
   a first inductor;
   a second inductor magnetically coupled to the first inductor;
   a current source whose current is variable, electrically connected to the first inductor; and
   a current control unit which controls a current flowing from the current source to the first inductor according to a feedback signal having frequency information in a current flowing in the second inductor to vary a combined inductance of the second inductor,
   wherein the current control unit comprises:
   a frequency divider for dividing a frequency of the feedback signal to a predetermined frequency;
   a phase detector for comparing a phase of the frequency divided signal with a phase of a reference signal having predetermined frequency information; and
   a charge pump for outputting a voltage to the current source according to an input from the phase detector, and
   wherein the current control unit adjusts a current value to be applied to the first inductor according to an input signal from the charge pump.

2. The inductance variable device according to claim 1, wherein the current source comprises:
   a plurality of coarse adjustment current sources operable to coarsely adjust a current value, wherein each coarse adjustment current source is set to a different predetermined coarse adjustment current value; and
   a fine adjustment current source operable to finely adjust the current value according to the input signal from the charge pump.

3. The inductance variable device according to claim 1, wherein the frequency divider comprises:
   a prescaler for dividing a frequency of an input signal by any of several ratios; and
   a counter for dividing a frequency of an input signal by a predetermined ratio.

4. The inductance variable device according to claim 1, further comprising:
   a switch provided between the first inductor and the current source, wherein the switch connects the first inductor with the current source or disconnects the first inductor from the current source.

5. The inductance variable device according to claim 1, wherein
   the first and second inductors are formed in a semiconductor integrated circuit on a semiconductor substrate.

6. The inductance variable device according to claim 1, wherein
   the first and second inductors are spirally formed of a strip-shaped conductor having one or more spirals.

7. The inductance variable device according to claim 1, wherein the current source is a DC power source.

8. The inductance variable device according to claim 1, wherein the current source can convert a direction of a direct current to be applied to the first inductor.

9. The inductance variable device according to claim 1, wherein the current source is an AC power source.

10. A method of varying inductance in an inductance variable device having a first inductor, a second inductor provided so as to be magnetically coupled to the first inductor, and a current source whose current is variable and that is electrically connected to the first inductor, the method comprising:
    (a) applying a predetermined current from the current source to the first inductor;
    (b) dividing a frequency of a feedback signal having frequency information in a current flowing in the second inductor so as to be able to be compared with a reference signal;
    (c) comparing a phase of the signal whose frequency was divided with a phase of the reference signal and outputting a difference signal corresponding to its difference; and
    (d) finely adjusting a current value to be applied to the first inductor by a voltage corresponding to the difference signal, to control the current value to be applied to the first inductor by repeating the above steps (b) to (d) so that the difference between the frequency divided signal and the reference signal becomes small, thereby a combined inductance in the second inductor is set to a predetermined value.

* * * * *